United States Patent [19]

Williams

[11] Patent Number: 5,000,254

[45] Date of Patent: Mar. 19, 1991

[54] DYNAMIC HEAT SINK

[75] Inventor: Edward J. Williams, Charlottesville, Va.

[73] Assignee: Digital Equipment Corporation, Maynard, Mass.

[21] Appl. No.: 368,822

[22] Filed: Jun. 20, 1989

[51] Int. Cl.$^5$ .......................... F28F 13/12; F28F 7/00; H05K 7/20

[52] U.S. Cl. ..................................... 165/85; 165/80.3; 165/94; 165/109.1; 165/185; 361/384

[58] Field of Search ................ 165/80.3, 85, 94, 109.1, 165/185; 361/384; 138/38

[56] References Cited

U.S. PATENT DOCUMENTS

| | | | |
|---|---|---|---|
| 3,844,341 | 10/1974 | Bimshas, Jr. et al. | 165/86 |
| 4,144,932 | 3/1979 | Voigt | 165/80 |
| 4,163,474 | 8/1979 | MacDonald et al. | 138/38 |
| 4,296,455 | 10/1981 | Leaycraft et al. | 361/383 |
| 4,327,398 | 4/1982 | Christison | 165/80.3 |
| 4,450,896 | 5/1984 | Opitz et al. | 165/80 |
| 4,832,114 | 5/1989 | Yeh | 165/109.1 |
| 4,852,642 | 8/1989 | Lee | 165/109.1 |

*Primary Examiner*—John Rivell
*Assistant Examiner*—L. R. Leo
*Attorney, Agent, or Firm*—Jones, Tullar & Cooper

[57] ABSTRACT

A dynamic heat sink having a stator incorporating a plurality of concentric annular cooling fins and a rotor having a plurality of downwardly extending wipers extending between the stator fins is disclosed. The wipers are constructed to fit closely into grooves formed between the adjacent stator cooling fins so that as the rotor spins, the wipers remove air close to the walls of the cooling fins and deter the development of boundary layer air to thereby enhance heat transfer to the cooling fluid. The wipers serve to move the heated air out of the grooves between the stator fins and upwardly into the free stream of cooling air for removal.

22 Claims, 4 Drawing Sheets

DYNAMIC HEAT SINK

BACKGROUND OF THE INVENTION

The present invention relates, in general, to a heat transfer device for electronic components, and more particularly is directed to a heat transfer device having a cylindrical stator portion carrying a plurality of spaced annular cooling fins and a rotor which carries wiper fins extending into annular slots between the cooling fins for moving heated air out of the stator.

As electronic components are made smaller and smaller, the problem of heat dissipation tends to increase, not only because the components may generate more heat as a result of the size decrease, but because they may generate more heat per unit area on a circuit board, for example. This heat problem becomes acute in the computer industry, where typically there are a large number of circuit components in a restricted area, such as on a printed circuit board. Many of these components, particularly high power devices, generate a great deal of heat, and a need exists for a device to cool such devices effectively and efficiently.

Most heat transfer devices presently available and in use today are static heat sinks which are secured to a heat source and which contain no moving parts. Such devices typically consist of a body portion contacting the heat source and a large number of fins extending from the body portion through which air flows to remove heat. Typically, the devices rely on air convection to remove the heat, or rely on a fan which forces air across the fins. In the first case, the heat transfer is inefficient and often slow, while in the second case the use of fans or blowers increases power consumption and may require special power supplies. Furthermore, fan or blower devices can be noisy, may induce vibration, and generally have a relatively limited life, and often require the use of a blower speed control to limit the shifting of thermal gradients. Another difficulty encountered in prior heat sink devices is that boundary layers form in the cooling fluid in the boundary areas between the heat sink cooling fins and the moving fluid. Thermal boundary layers reduce the thermal gradient adjacent to the cooling fins and thus interfere with the efficient cooling of the fins. Momentum boundary layers reduce the velocity, and thus the flow, of the cooling fluid adjacent to the cooling fins. This also reduces the effectiveness of the heat sink. Prior heat sink devices have traditionally been designed so that the momentum boundary layer at one fin will not develop to a thickness that will cause it to meet the boundary layer developing at the next adjacent fin. However, such structures, unlike the dynamic heat sink, do not prevent the development of momentum and thermal boundary layers.

SUMMARY OF THE INVENTION

The present invention is directed to a heat transfer device having a body portion which contacts a source of heat which is to be dissipated and which has a plurality of annular, coaxial, upstanding cooling fins spaced apart by annular slots. A rotor is mounted on the stator and carries a plurality of wiper fins which extend into the stator slots and which rotate through the slots as the rotor is driven. The heat sink rotor preferably carries aerodynamic foils that utilize the flow of air through or past the heat sink to cause rotation, although other modes of rotation may be provided. The rotor wipers extend into the slots between the annular cooling fins, with the edges of the wipers being spaced very close to, or with the use of whiskers or brushes, in light contact with, the corresponding adjacent surfaces of the cooling fins. As the rotor, and consequently the wipers, spin, the edges of the wipers pass along the surfaces of the cooling fins to prevent formation of momentum and thermal boundary layers in the cooling fluid which normally develop on traditional finned heat sinks. By preventing these boundary layers from developing, heat transfer from the heat sink is enhanced. This dynamic heat sink prevents the formation of both thermal and momentum boundary layers. Future references to boundary layer in this text will be understood to mean both the thermal and momentum boundary layers unless otherwise stated. These wipers not only prevent formation of the boundary layer, but also serve to move the heated fluid out of the region between the heated fins and up into the free stream of cooling fluid, where it can be carried away from the heat sink, and thus away from the electronic components. As the rotor spins, the wipers draw the heated fluid out of the annular slots, and draw free stream fluid into the slots, to be heated and moved out again.

BRIEF DESCRIPTION OF THE DRAWINGS

The foregoing and additional objects, features and advantages of the present invention will become apparent to those skilled in the art from a more detailed consideration of the preferred embodiments thereof, taken in conjunction with the accompanying drawings, in which.

DESCRIPTION OF PREFERRED EMBODIMENTS

Figure 1:
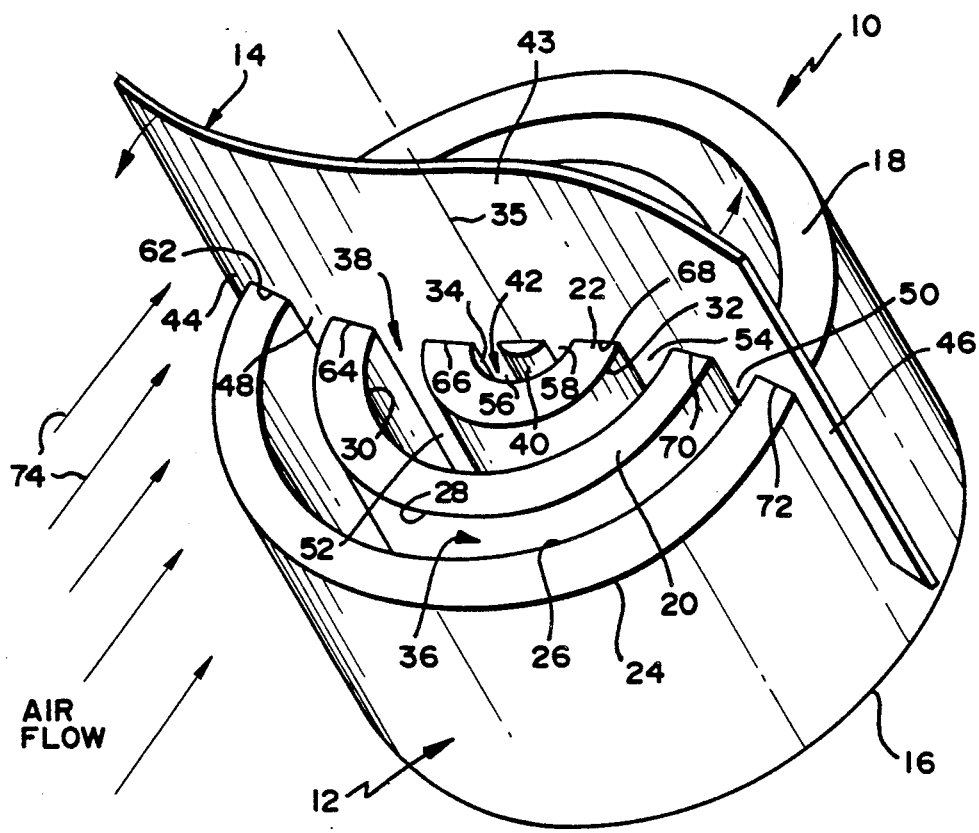
FIG. 1 is a top perspective view of one form of the invention, showing a dynamic heat sink incorporating a stator having annular grooves and a rotor incorporating wiper fins mounted therein.

Turning now to a more detailed consideration of the present invention, there is illustrated in FIG. 1 a dynamic heat sink generally indicated at 10 which incorporates a stationary portion, or stator 12, and a rotary portion, or rotor 14, mounted in and supported by the stator. The stator incorporates a base 16 which contacts a source of heat which is to be dissipated; for example, an electronic component carried on a printed circuit board. The base 16 contacts the circuit component in known manner and incorporates a plurality of vertically upstanding, coaxial, annular walls which serve as heat-radiating cooling fins. In the embodiment of FIG. 1, three such annular cooling fins are illustrated: an outer fin 18, an intermediate fin 20, and an inner fin 22. Each cooling fin includes inner and outer wall surfaces, the outer fin 18 being defined by an outer wall surface 24 and an inner wall surface 26, the intermediate fin 20 being defined by an outer wall surface 28 and an inner wall surface 30, and the inner fin 22 being defined by an outer wall surface 32 and an inner wall surface 34. Each of the inner and outer wall surfaces are cylindrical and concentric about a stator axis 35 to define vertically upright cooling fins of uniform thickness. These fins are spaced apart to define annular cooling grooves such as the groove 36 between the inner surface 26 of fin 18 and the outer surface 28 of fin 20. In similar manner, an annular groove 38 is formed between the inner surface 30 of fin 20 and the outer surface 32 of fin 22.

The heat sink preferably is of a highly thermally conductive material such as aluminum which efficiently transfers heat received from the source by way of base 16 to the annular fins 18, 20 and 22. The heat is transferred from the fins to a cooling fluid which is in contact with the inner and outer wall surfaces of the fins. The rate at which heat is transferred from the fins to the cooling fluid is directly proportional to the difference in temperature between the fin and that fluid. The concentric arrangement of the annular heat-dissipating fins 18, 20 and 22 maximizes the available surface for transferring heat to the ambient cooling fluid, which may be air or other suitable fluids.

In conventional heat sinks, a boundary layer forms in the cooling medium at the surface to be cooled, due to the flow characteristics of the medium. This boundary layer in effect adheres to the cooling fin surface and is heated, thereby reducing the thermal gradient between the cooling fin surface and the cooling medium and reducing the cooling efficiency.

In order to improve the transfer of heat from the annular fins, the rotor 14 is mounted on the heat sink for rotation with respect to the stator 12. The rotor is generally thin and light in weight so that it can be easily rotated, and is coaxial with and extends diametrically across the stator with the plane of the rotor containing the vertical axis 35 of the stator. The rotor includes a central post 40 which extends into a central, cylindrical bore 42 defined by the inner wall 34 and surrounded by the annular cooling fin 22. The post 40 is mounted on a suitable bearing (not shown) within the bore 42 to permit rotation of the rotor 14 with respect to the stator 12 while maintaining the rotor coaxial with the stator. The rotor includes a top foil portion 43 and a plurality of downwardly extending finger-like wipers which preferably are integrally formed with the foil portion. The rotor includes outer wipers 44 and 46 which extend downwardly outside the annular fin 18 at diametrically opposite locations, wipers 48 and 50 which extend downwardly into groove 36, wipers 52 and 54 which extend downwardly into groove 38 and wipers 56 and 58 which extend downwardly on either side of central post 40 into the bore 42. The upper foil portion 43 extends substantially diametrically across the stator 12, although it may be curved slightly, in the manner illustrated. The downwardly extending wipers of the rotor define a plurality of slots such as those illustrated at 62, 64 and 66 on the left-hand side of the rotor 14, as viewed in FIG. 1, which slots receive the annular cooling fins 18, 20 and 22, respectively. Similarly, the right-hand side of the rotor 14 incorporates a plurality of slots 68, 70 and 72 formed between the downwardly extending wipers to receive the annular cooling fins 22, 20 and 18, respectively.

The downwardly extending wipers which are formed as a part of the rotor 14 preferably are finger-shaped elements of a relatively thin, lightweight material such as aluminum, and are dimensioned to extend transversely across, and to fit snugly into their respective annular stator grooves so that the side edges of the wipers are very close to the adjacent wall surfaces of the stator annular fins 18, 20 and 22, and so that the slots formed in the rotor snugly receive corresponding cooling fins. When the rotor 14 is rotated, the downwardly extending wipers move through their respective stator grooves to act as wipers for the cooling fluid within the grooves, and to thereby inhibit formation of boundary layers. Similarly, the outer wipers 44 and 46 move around the outer surface of the stator, serving to inhibit the formation of a boundary layer on the outer wall surface 24 of the stator.

Figure 2:
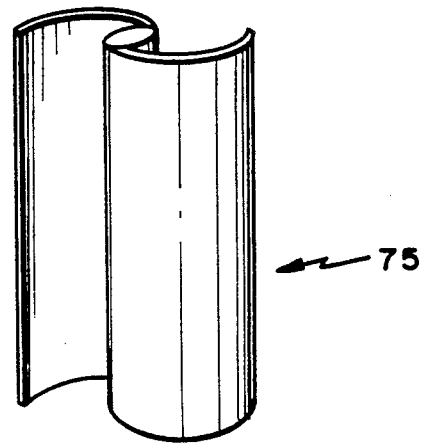
FIG. 2 is a diagrammatic illustration of an airfoil suitable for use with the rotor of FIG. 1.

Rotation of the rotor 14 is produced by a flow stream of the cooling fluid, indicated by the arrows 74. This stream of fluid, which may be air, is directed across the heat sink 10 in conventional manner to remove heated air from around the heat sink. The flow stream is also directed against the exterior wipers 44 and 46, and these two outer wipers may also be aerodynamically shaped to produce, or to assist in the production of, rotation of rotor 14. Aerodynamic wipers 44 and 46 would have the characteristic that they would have a higher coefficient of drag on one side than on the other, and this difference in drag would cause the rotor to spin when placed in a fluid flow stream. The flow of air across the foil portion 43 of the rotor is also used to produce rotation of the rotor by providing an aerodynamic shape for the rotor that provides a higher coefficient of drag on one side than on the other. This difference in drag forces on the foil causes the rotor to spin when placed in a fluid flow stream. A Savonius rotor 75 as shown in FIG. 2 could be utilized for the foil portion 43 of this rotor.

The rotational motion of the rotor 14 and the depending wipers 44, 46, 48, 50, 52, 54, 56 and 58 constantly moves the air in the annular grooves 36 and 38, in the bore 42, and around the outer surface 24 of fin 18 to constantly move the air that has been heated by its contact with or its close proximity with, the heat sink walls 18, 20 and 22. This rotational motion carries the warmed air into the stream 74, and as this warmer air is removed and moved up into the free stream to be carried away, cooler air from the free stream 74 moves down into the grooves, to be heated. In this manner, heat is removed from the heat sink, with the close contact between the downwardly extending wipers and the inner and outer surfaces of the annular cooling fins ensuring movement of the heated air and inhibiting formation of boundary layers along the surfaces of the heat sink stator fins. The existence of boundary layers on these cooling fins in conventional heat sinks reduces the heat transfer that can be achieved, since the boundary layer is at a higher temperature than the air closer to the center of the grooves. Removing this heated boundary layer air allows cooler free stream air to come in contact with the surfaces of the stator cooling fin walls and increases the temperature difference that drives the thermal transfer This increases the heat transfer rates that can be achieved, hence increasing the efficiency of the heat sink.

Figure 3:
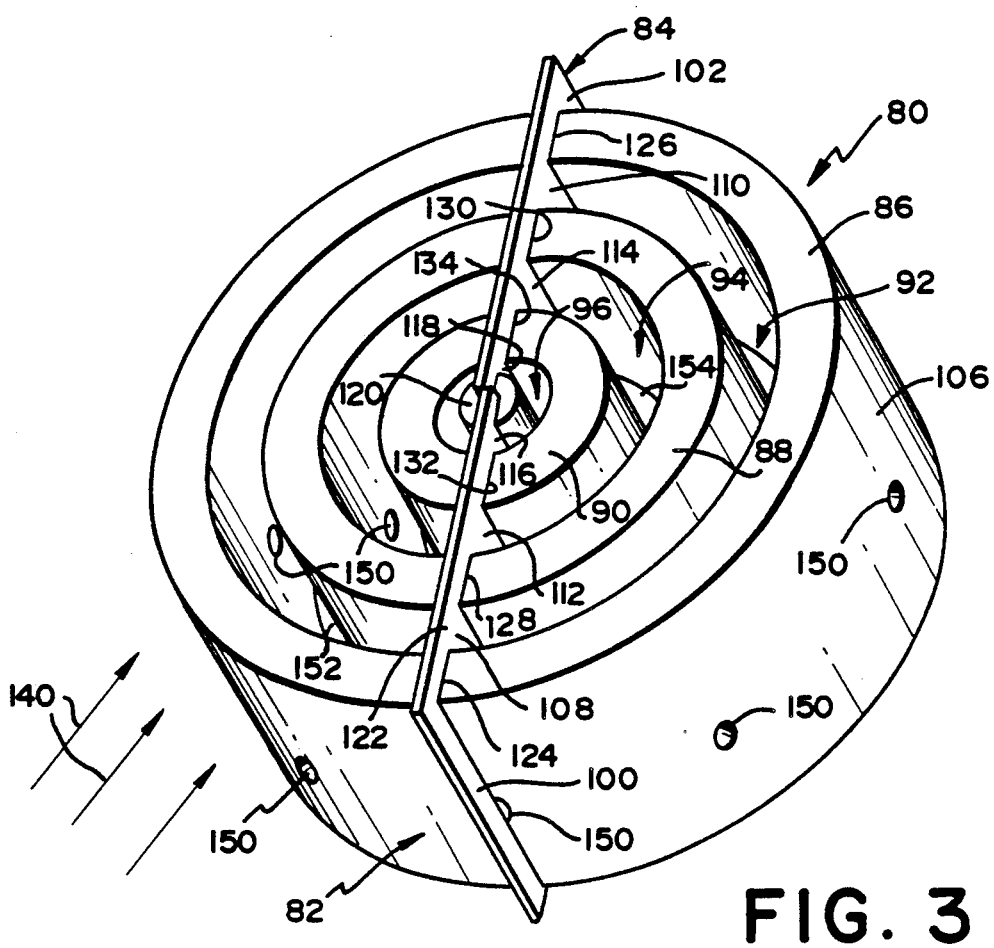
FIG. 3 is a top perspective view of a second embodiment of the invention, showing a dynamic heat sink having a stator, a rotor mounted therein, and a plurality of air flow apertures in the stator walls.

An alternative form of the heat sink of the present invention is illustrated in FIG. 3. If sufficient space for the foil portion 43 of the rotor in FIG. 1 is not available, the exterior wipers would utilize an aerodynamic shape similar to foils that have been used to produce rotation in vertical axis wind machines This device includes a stator 82 and a rotor 84 mounted therein for rotation in the manner described above. The stator includes a plurality of concentric annular cooling fins including an outer fin 86, an intermediate fin 88, and an inner fin 90 defining annular grooves 92 and 94 and a central bore 96 in the manner described above with respect to FIG. 1. The rotor 84 includes a plurality of downwardly extending wipers, including outer wipers 100 and 102 lightly contacting, as by way of whiskers or brushes, or closely adjacent to the outer surface 106 of outer cooling fin 86. The rotor also includes a pair of downwardly extending wipers 108 and 110 which are in light contact with or are closely adjacent the wall surfaces forming the groove 92, downwardly extending wipers 112 and 114 in light contact with or closely adjacent the wall surfaces forming groove 94, and wipers 116 and 118 in light contact with or closely adjacent the surface of bore 96. The rotor 84 is shown as being mounted on a central post 120 which is coaxial with the stator 82 and thus with the bore 96.

The wipers 100, 102, 108, 110, 112, 114, 116 and 118 depend from, and may be integrally formed with, a generally transverse support portion 122. The wipers define slots 124 and 126, which receive annular fin 86, slots 128 and 130, which receive annular fin 88, and slots 132 and 134, which receive annular fin 90. The support portion 122 may carry an upper foil portion such as that illustrated at 43 in FIG. 1, if desired, but in this embodiment the outer wiper fins 100 and 102 are aerodynamically formed to respond to an external air flow such as that illustrated by arrows 140 to impart rotary motion to the rotor 84.

To improve operation of the device of FIG. 3, a plurality of air flow holes 150 are drilled through the stator cooling fins 86, 88 and 90. These holes facilitate air flow into the slots 92, 94 and into the bore 96 so that the motion of the rotor 84 produces a pumping action as the wipers pass by the holes.

Figure 4:
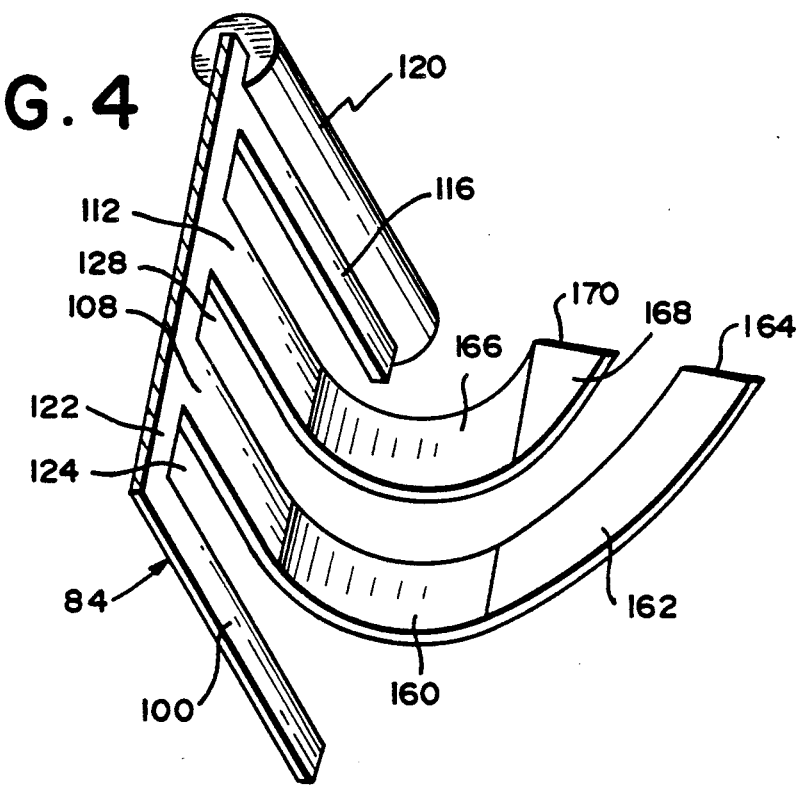
FIG. 4 is a perspective view of a rotor wiper usable in the dynamic heat sink of FIG. 3.
Figure 5:
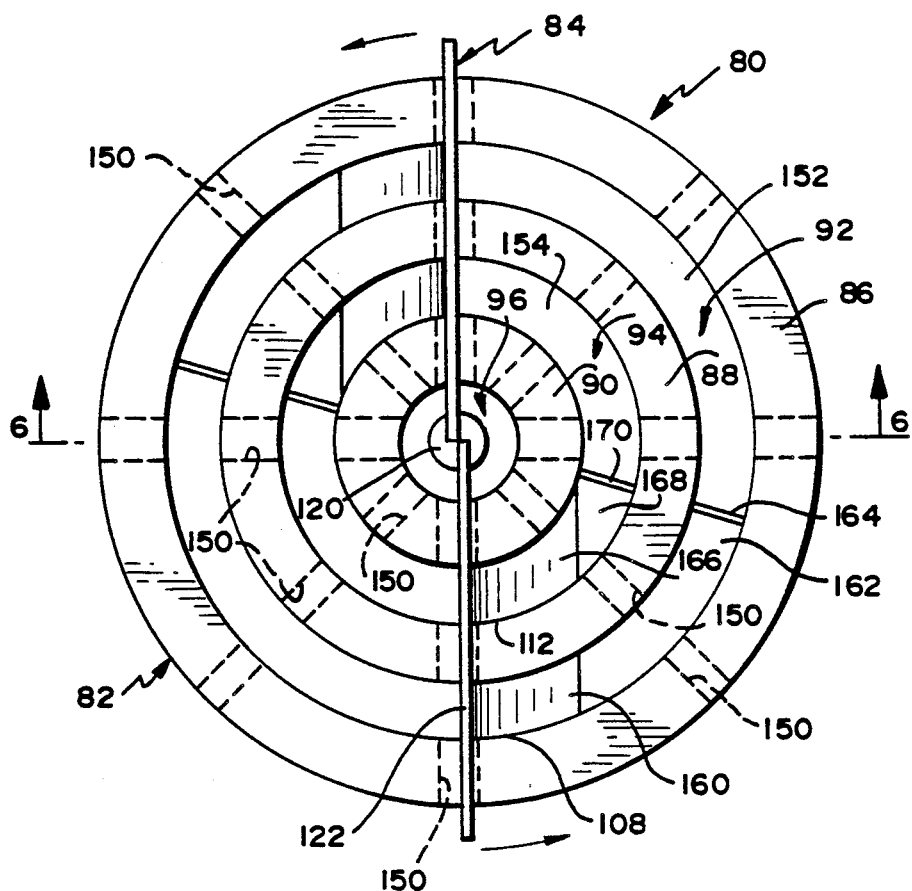
FIG. 5 is a top plan view of the dynamic heat sink of FIG. 3.

The wipers extend vertically downwardly into the respective grooves and terminate adjacent to or in light contact with the bottom wall 152 of groove 92, the bottom wall 154 of groove 94, and the bottom of bore 96 (not shown) so as to wipe away the boundary layer cooling fluid at the bottom of these grooves in the same manner that the boundary layers around the vertical cooling fin surfaces are removed. The wipers may extend vertically downwardly to the bottom walls or, in the preferred form of the invention as illustrated in FIGS. 4 and 5, each may curve in the direction of rotation as it approaches the bottom wall of its corresponding groove to form air scoops which lift the air upwardly and out of the grooves 92 and 94. As illustrated in FIG. 4, the scoop-shaped wipers 108 and 112 extend vertically downwardly from the transverse support 122 into their corresponding grooves. As illustrated for wiper 108, the lower half of the wiper is curved forwardly, at 160, with the curved portion forming an approximately 90° turn toward the horizontal. The bottom portion of the wiper merges into a forwardly extending scraper portion 162 which is generally parallel to the bottom of the groove. The forward edge of portion 162 is tapered as at 164 so as to provide light contact with, or to be closely adjacent to, the bottom surface 152 of groove 92. As illustrated in the top view of FIG. 5, the wiper 108 is not only curved forwardly as at 160, but is also curved laterally so as to conform to the annular shape of the groove 92; that is, it has a transverse curvature having a radius equal to the radius of the curvature of groove 92.

In similar manner, the downwardly extending wiper 112 has a forwardly curved portion 166 which is approximately a 90° curve so that its forward end 168 is substantially parallel to and lightly in contact with or closely adjacent to the bottom wall 154 of groove 94. A tapered front edge 170 provides a scraping action along the surface 154 so as to direct boundary layer cooling fluid, such as air, upwardly and out of the groove as the rotor 84 turns in a counterclockwise direction as viewed in FIG. 5. This light scraping and wiping action provided by the rotor 84 provides improved cooling action for the surfaces of the stator 82 in the manner described with respect to FIG. 1.

Figure 6:
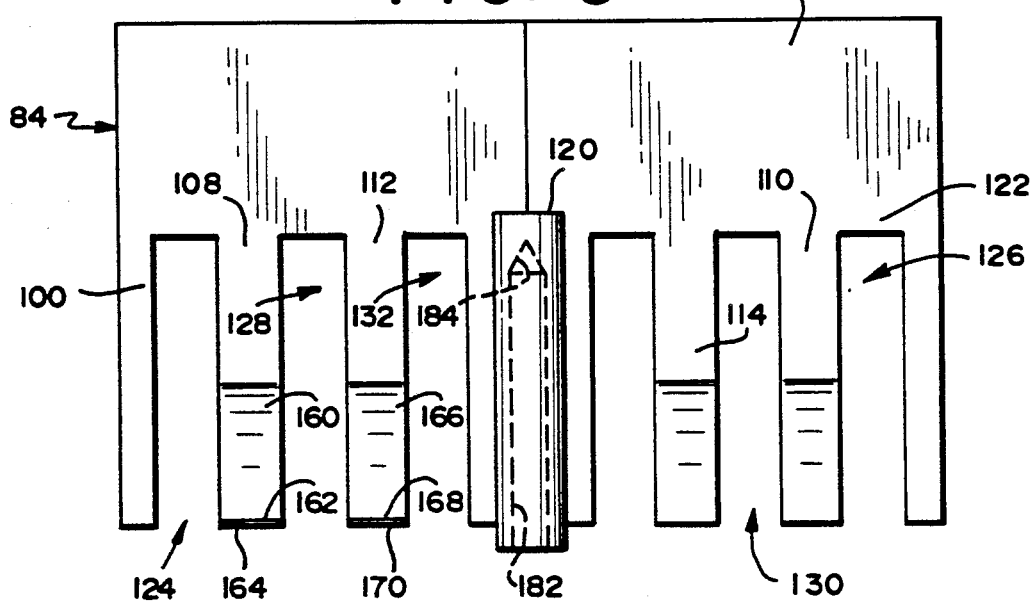
FIG. 6 is a front elevation of the rotor and wiper assembly for the apparatus of FIG. 3.
Figure 7:
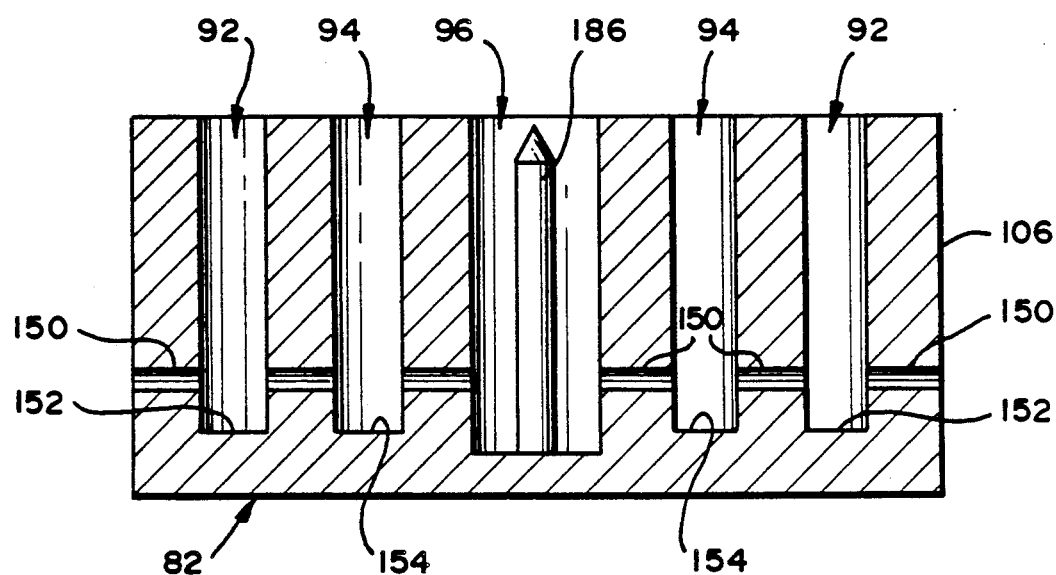
FIG. 7 is a cross-sectional view of the stator taken along line 6—6 of FIG. 5.

FIG. 6 is a front elevation view of the rotor 84, incorporating an upper foil portion 180 which responds to air flow to produce rotation of the rotor. As illustrated in phantom in FIG. 6, the central post 120 may incorporate an internal bore 182 having a tapered upper end 184 for receiving the spindle 186 mounted axially in the bore 96 formed in the center of the stator 82, as illustrated in FIG. 7. The spindle 186 receives the central post 120 and supports the rotor 84 for rotation in the stator 82.

Thus there has been disclosed a dynamic heat sink which utilizes a stator having a plurality of annular cooling fins and a rotor having depending wipers extending into the grooves between adjacent stator fins. The rotor is caused to rotate within the stator to produce a wiping action along the cooling fin walls so as to force warmed air out of the spaces between the cooling fins to improve the thermal transfer of the heat sink. The rotor wipers are constructed to fit snugly in the slots so as to lightly contact or be closely adjacent to the surfaces of the cooling fins. The wipers remove air from the boundary layer region along the surfaces of the cooling fins, thereby preventing development of a significant fluid boundary layer and enhancing the transfer of heat from the fins to the cooling fluid. Although the present invention has been disclosed in terms of preferred embodiments, numerous modification and variations may be made without departing from the true spirit and scope of the invention as set forth in the following claims.

What is claimed is:

1. A dynamic heat sink comprising:
   a stator having a base and at least one cooling fin having surfaces for transferring heat between a heat source and a cooling fluid;
   wiper means mounted for motion with respect to said stator, said wiper means being closely adjacent to said cooling fin surfaces; and
   means responsive to a stream of cooling fluid moving said wiper means along said cooling fin surfaces to enhance a flow of a cooling fluid along said cooling fin surfaces and to thereby inhibit formation of cooling fluid boundary layers at said cooling fin surfaces.

2. The dynamic heat sink of claim 1, wherein said stator cooling fin is annular, and wherein said wiper means includes a rotor mounted on said stator.

3. The dynamic heat sink of claim 2, wherein said wiper means includes a plurality of depending wipers mounted on said rotor for motion with respect to said cooling fin.

4. The dynamic heat sink of claim 3, wherein said means responsive to a stream of cooling fluid includes aerodynamic means connected to said rotor.

5. The dynamic heat sink of claim 1, wherein said stator cooling fin is annular, and wherein said wiper means is a rotor mounted on said stator.

6. The dynamic heat sink of claim 1, wherein said stator includes a plurality of annular cooling fins, and wherein said wiper means includes a plurality of wipers closely adjacent to corresponding cooling fin surfaces.

7. The dynamic heat sink of claim 6, wherein said annular stator cooling fins are concentric.

8. The dynamic heat sink of claim 7, wherein said wiper means is a rotor mounted on said stator and carrying a plurality of depending wiper fins extending between adjacent concentric stator cooling fins.

9. A dynamic heat sink comprising:
a generally cylindrical stator having a base for contacting a heat source and a plurality of upstanding annular, coaxial cooling fins each having an inner and an outer cooling surface, adjacent cooling fins being spaced apart to define annular cooling grooves therebetween;
a generally, thin, lightweight, rotor mounted on said stator for rotational movement with respect thereto, said rotor being coaxial with said stator;
a plurality of thin, finger-shaped wipers on said rotor and extending into corresponding annular cooling grooves, each said wiper extending transversely across its corresponding groove, and having side edges closely adjacent to the surfaces of the annular cooling fins defining its corresponding cooling groove; and
means rotating said rotor with respect to said stator, whereby said wipers move along the surfaces of said cooling fins to enhance a flow of a cooling fluid into said cooling grooves and along said cooling fin surfaces, and to inhibit formation of cooling fluid boundary layers.

10. The dynamic heat sink of claim 9, further including fluid apertures through said cooling fins.

11. The dynamic heat sink of claim 9 wherein said means rotating said rotor comprises aerodynamic means on said rotor responsive to a stream of cooling fluid directed across said stator.

12. The dynamic heat sink of claim 9, wherein each said finger-shaped element is curved downwardly and forwardly in the direction of rotation of said rotor to form a scoop which tends to lift cooling fluid out of its corresponding groove upon rotation.

13. The dynamic heat sink of claim 12, wherein each said finger element is further curved transversely to match the shape of its corresponding cooling groove.

14. A dynamic cooling method for electronic components, comprising:
positioning on a heat source a generally cylindrical heat sink having a plurality of annular, concentric cooling fins;
passing a free stream of cooling fluid across said heat sink;
inserting a plurality of wipers into annular cooling grooves between adjacent cooling fins; and
providing an aerodynamic surface for said wipers which responds to said free stream of cooling air to move said wipers along said cooling grooves to draw cooling fluid into said cooling grooves, to eject heated cooling fluid from said cooling grooves, and to inhibit formation of boundary layers along the surface of said cooling fins.

15. A dynamic heat sink for transferring heat from a heat source to a cooling fluid moving with respect to said heat sink, comprising:
a stator having a body portion adapted to contact in heat transfer relationship a source of heat which is to be dissipated, said stator further including at least one annular cooling fin having inner and outer cooling surfaces, said fin being mounted on said body portion and adapted to extend into a relatively moving cooling fluid, whereby the fluid flows across at least one of said fin cooling surfaces in heat exchange relationship;
wiper means mounted for relative motion with respect to said stator, said wiper means being shaped to draw cooling fluid into said annular cooling fin, along said inner surface, and thereafter to move said fluid out of said annular cooling fin, and wiper means extending sufficiently close to said inner cooling surface of said cooling fin that motion of the wiper means prevents formation of momentum and thermal boundary layers in the cooling fluid at the fin inner cooling surface; and
means moving said wiper means along said cooling fin inner surface to carry cooling fluid therealong to prevent formation of said boundary layers.

16. The dynamic heat sink of claim 15, wherein said wiper means includes at least one element having a curved surface movable along said inner surface and shaped to lift cooling fluid away from said inner surface to prevent formation of boundary layers on said inner surface.

17. The dynamic heat sink of claim 16, wherein said wiper means includes means responsive to the relative motion of said cooling fluid with respect to said stator to move said wiper means with respect to said inner surface.

18. The dynamic heat sink of claim 17 wherein said stator includes a plurality of cooling fins, said fins being annular and concentric so that the inner and outer walls thereof cooperate to form a plurality of annular cooling grooves between adjacent cooling fin surfaces and wherein said wiper means includes a plurality of wiper elements, each extending into a corresponding cooling groove closely adjacent the inner and outer surfaces thereof to prevent the formation of boundary layers, each said wiper element being shaped to draw cooling fluid into a corresponding annular groove, to carry the cooling fluid along said inner and outer surfaces of said cooling grooves, and to lift cooling fluid out of said grooves.

19. A dynamic heat sink for transferring heat from a heat source to a cooling fluid moving with respect to said heat sink, comprising:
a stator having a body portion adapted to contact in heat transfer relationship a source of heat which is to be dissipated, said stator further including at least two annular, concentric cooling fins spaced apart to define an annular groove, each fin having a cooling surface, each fin being mounted on said body portion and adapted to extend into a relatively moving cooling fluid, whereby the fluid flows across said fin cooling surfaces in heat exchange relationship;
a plurality of discrete wiper elements mounted for relative motion with respect to said stator and within and along said groove, each said wiper element being elongated and curved in the direction of its motion and extending sufficiently close to said cooling surfaces of said cooling fins that motion of the wiper element lifts cooling fluid out of said groove and prevents formation of momentum and thermal boundary layers in the cooling fluid at the fin cooling surfaces; and means moving said wiper elements along said cooling fin surface to carry cooling fluid therealong to prevent formation of said boundary layers.

20. The dynamic heat sink of claim 19, wherein said wiper means is mounted concentrically with respect to said annular groove, whereby rotation of said wiper means causes said wiper elements to move successively along said groove.

21. The dynamic heat sink of claim 20, wherein said stator includes a plurality of concentric cooling fins spaced apart to define a plurality of concentric cooling grooves, and wherein said wiper means includes a plurality of wiper elements mounted for motion within and along each said annular groove.

22. The dynamic heat sink of claim 21, wherein said wiper means includes means responsive to the relative motion of said cooling fluid to cause said wiper elements to move along corresponding annular grooves.

* * * * *